United States Patent
Chi et al.

(10) Patent No.: US 9,640,428 B2
(45) Date of Patent: May 2, 2017

(54) SELF-ALIGNED REPAIRING PROCESS FOR BARRIER LAYER

(71) Applicant: TAIWAN SEMICONDUCTOR MANUFACTURING CO., LTD., Hsinchu (TW)

(72) Inventors: Chih-Chien Chi, Hsinchu (TW); Chung-Chi Ko, Nantou County (TW); Mei-Ling Chen, Kaohsiung (TW); Huang-Yi Huang, Hsinchu (TW); Szu-Ping Tung, Taipei (TW); Ching-Hua Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/077,761

(22) Filed: Mar. 22, 2016

(65) Prior Publication Data

US 2016/0204060 A1 Jul. 14, 2016

Related U.S. Application Data

(62) Division of application No. 14/151,711, filed on Jan. 9, 2014, now Pat. No. 9,324,606.

(51) Int. Cl.

| | |
|---|---|
| *H01L 21/768* | (2006.01) |
| *H01L 23/528* | (2006.01) |
| *H01L 23/532* | (2006.01) |

(52) U.S. Cl.
CPC .. *H01L 21/76843* (2013.01); *H01L 21/76807* (2013.01); *H01L 21/76831* (2013.01); *H01L 21/76855* (2013.01); *H01L 21/76868* (2013.01); *H01L 21/76876* (2013.01); *H01L 23/528* (2013.01); *H01L 23/53209* (2013.01); *H01L 23/53223* (2013.01); *H01L 23/53238* (2013.01); *H01L 23/53261* (2013.01);
(Continued)

(58) Field of Classification Search
CPC ......... H01L 21/76843; H01L 21/76846; H01L 21/76877; H01L 23/53238; H01L 23/53223
See application file for complete search history.

(56) References Cited

U.S. PATENT DOCUMENTS 8,268,397 B2 9/2012 Cho et al.
2003/0010645 A1* 1/2003 Ting ...................... H01L 21/288
205/170
(Continued)

OTHER PUBLICATIONS

Notice of Allowance U.S. Appl. No. 14/151,711 dated Dec. 23, 2015.
(Continued)

*Primary Examiner* — Quoc Hoang
(74) *Attorney, Agent, or Firm* — McDermott Will & Emery LLP

(57) ABSTRACT

A self-aligned repairing process for a barrier layer is provided. A repair layer is formed by chemical vapor deposition using an organometallic compound as a precursor gas. The precursor gas adsorbed on a dielectric layer exposed by defects in a barrier layer is transformed to an insulating metal oxide layer, and the precursor gas adsorbed on the barrier layer is transformed to a metal layer.

20 Claims, 5 Drawing Sheets

(52) U.S. Cl.
CPC .... *H01L 23/5329* (2013.01); *H01L 23/53252* (2013.01); *H01L 23/53266* (2013.01); *H01L 2924/0002* (2013.01)

(56) References Cited

U.S. PATENT DOCUMENTS

| | | |
|---|---|---|
| 2008/0045013 A1 | 2/2008 | Lavoie et al. |
| 2015/0111316 A1 | 4/2015 | Koschinsky et al. |

OTHER PUBLICATIONS

Non-Final Office Action U.S. Appl. No. 14/151,711 dated Aug. 25, 2015.

Non-Final Office Action U.S. Appl. No. 14/151,711 dated Jan. 15, 2015.

\* cited by examiner

SELF-ALIGNED REPAIRING PROCESS FOR BARRIER LAYER

REFERENCE TO RELATED APPLICATION

The present application is a divisional application of U.S. application Ser. No. 14/151,711, filed Jan. 9, 2014, which is hereby incorporated by reference in its entirety.

BACKGROUND

As the design rule for integrated circuits is continuously scaled down, the dimension of damascene opening is continuously reduced. Therefore, the step coverage of a barrier layer covering the inner surface of the damascene opening is getting worse, and defects may be formed in the barrier layer. For example, if 30-50 Å of barrier layer is blanket deposited on a wafer, the thickness of the barrier layer on sidewalls of openings, including vias and trenches, may be less than 5-10 Å. Therefore, defects can be easily formed in the barrier layer located on sidewalls of openings.

Since barrier layer is used to surrounding the later formed metal interconnect to prevent metal from diffusing into the dielectric layer where the damascene opening is located, these defects in the barrier layer provide passages for the metal diffusion. Moreover, the low-k dielectric layer mostly made from porous dielectric materials make the problem of metal diffusion through defects in the barrier layer more serious, since the larger the total pore volume of the porous dielectric material has, the lower the dielectric constant of the porous dielectric material has.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
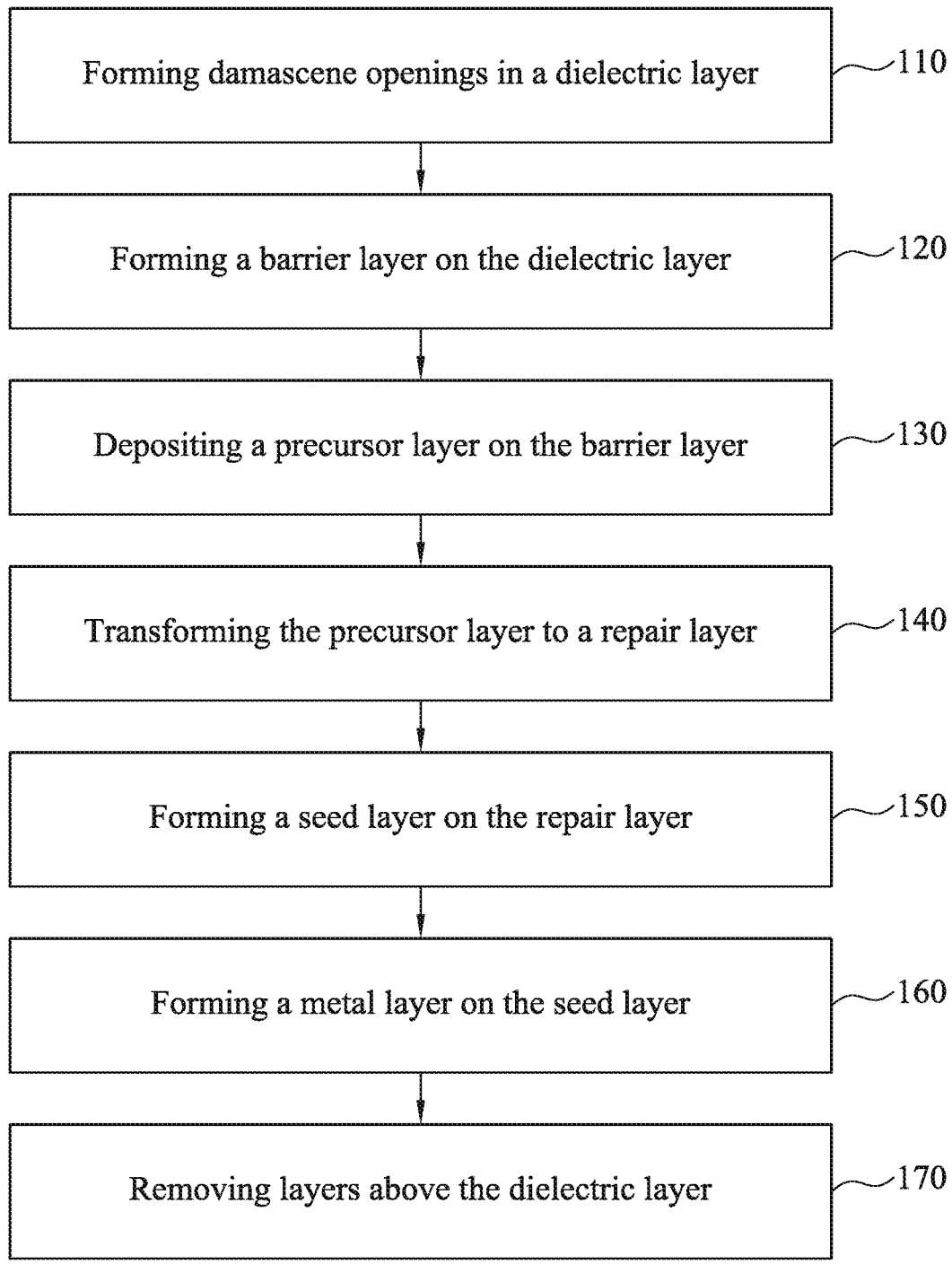
FIG. 1 is a flowchart of a self-aligned repairing process for a barrier layer according some embodiments of this disclosure.

The drawings, schematics and diagrams are illustrative and not intended to be limiting, but are examples of embodiments of the disclosure, are simplified for explanatory purposes, and are not drawn to scale.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a self-aligned repairing process for a barrier layer is provided. A damascene opening is formed in a dielectric layer on a substrate, and the surface of the dielectric layer has free hydroxyl groups. A barrier layer is then on the dielectric layer to cover inner surfaces of the damascene opening. A precursor layer is formed on the barrier layer by chemical vapor deposition using an organometallic compound containing a central metal atom as a precursor gas, wherein the central metal atom can be Al, Ru, Co, Mn, or Ta, for example. Finally, the precursor layer is transformed to a repair layer. The precursor layer on the dielectric layer exposed by defects in the barrier layer is transformed to an insulating metal oxide layer, and the precursor layer on the barrier layer is transformed to a metal layer.

According to some other embodiments, a method of forming a damascene structure is provided. A damascene opening is formed in a dielectric layer on a substrate, and the surface of the dielectric layer has free hydroxyl groups. A barrier layer is then on the dielectric layer to cover inner surfaces of the damascene opening. A repair layer is deposited on the barrier layer by chemical vapor deposition using an organometallic compound containing a central metal atom as a precursor gas. The central metal atom can be Al, Ru, Co, Mn, or Ta, for example. The precursor gas adsorbed on the dielectric layer exposed by defects in the barrier layer is transformed to an insulating metal oxide layer, and the precursor gas adsorbed on the barrier layer is transformed to a metal layer. Next, a seed layer is deposited on the repair layer. A metal layer is formed on the seed layer to fill in the damascene opening. An upper portion of the metal layer, the seed layer, the repair layer, the barrier layer, and the dielectric layer is then removed to form a metal interconnect in the damascene opening.

According to some other embodiments, a damascene structure is also provided. In the damascene structure, a dielectric layer is disposed on a substrate, wherein the dielectric layer has a damascene opening. A barrier layer is disposed on inner surface of the damascene opening. A repair layer is disposed on the barrier layer, wherein the repair layer disposed on the barrier layer is composed of a metal, and the repair layer disposed on the dielectric layer exposed by defects in the barrier layer is composed of insulating metal oxide. A seed layer is disposed on the repair layer. A metal interconnect is disposed in the damascene opening.

FIG. 1 is a flowchart of a self-aligned repairing process for a barrier layer according some embodiments of this disclosure. FIGS. 2A-2G are cross-sectional diagrams showing a self-aligned repairing process for a barrier layer according some embodiments of this disclosure. FIGS. 1 and 2A-2G are referred below at the same time.

Figure 2A:
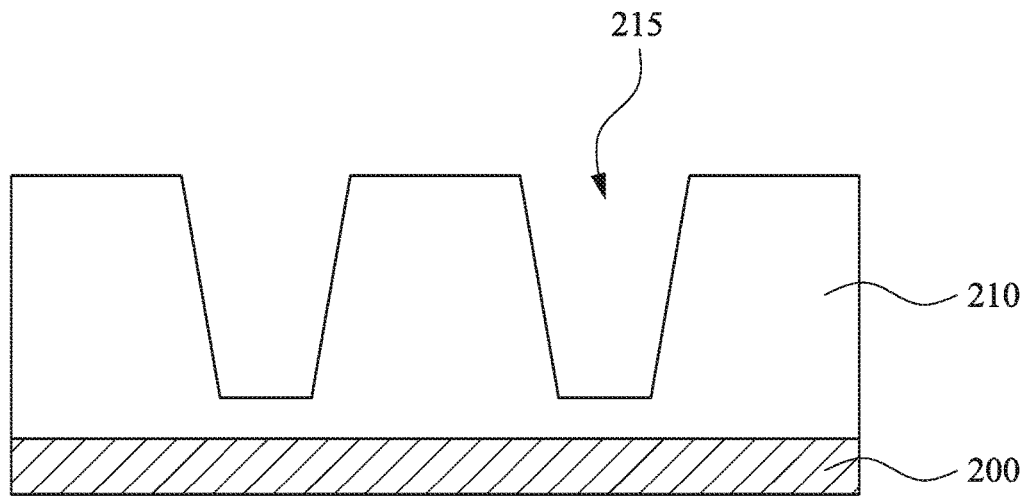
FIGS. 2A-2G are cross-sectional diagrams showing a self-aligned repairing process for a barrier layer according some embodiments of this disclosure.

In step 110 of FIG. 1 and FIG. 2A, damascene openings 215 are formed in a dielectric layer 210 on a substrate 200. The dielectric layer 210 can be made from a low-k dielectric material having some free hydroxyl (—OH) groups on the surface thereof. The low-k dielectric material is defined to be a dielectric material have a dielectric constant lower than the dielectric constant of silicon dioxide. Common low-k dielectric material includes fluorine-doped silicon dioxide, carbon-doped silicon dioxide, porous silicon dioxide, porous carbon-doped silicon dioxide, spin-on silicone based polymeric dielectric (such as hydrogen silsesquioxane (HSQ) and methylsilsesquioxane (MSQ)). The method of forming the damascene openings 215 can be photolithography and etching, for example.

Figure 2B:
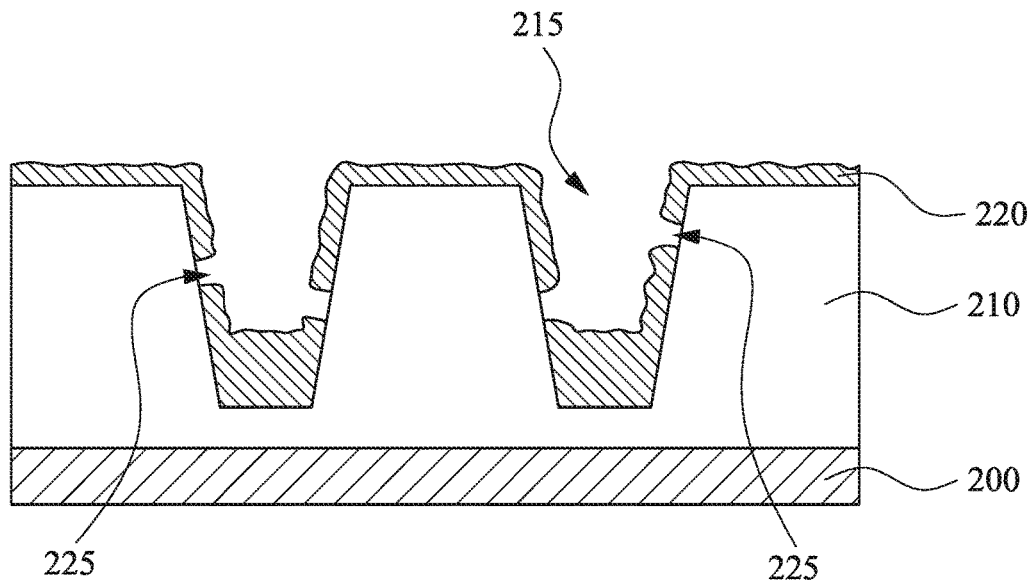
Figure 2C:
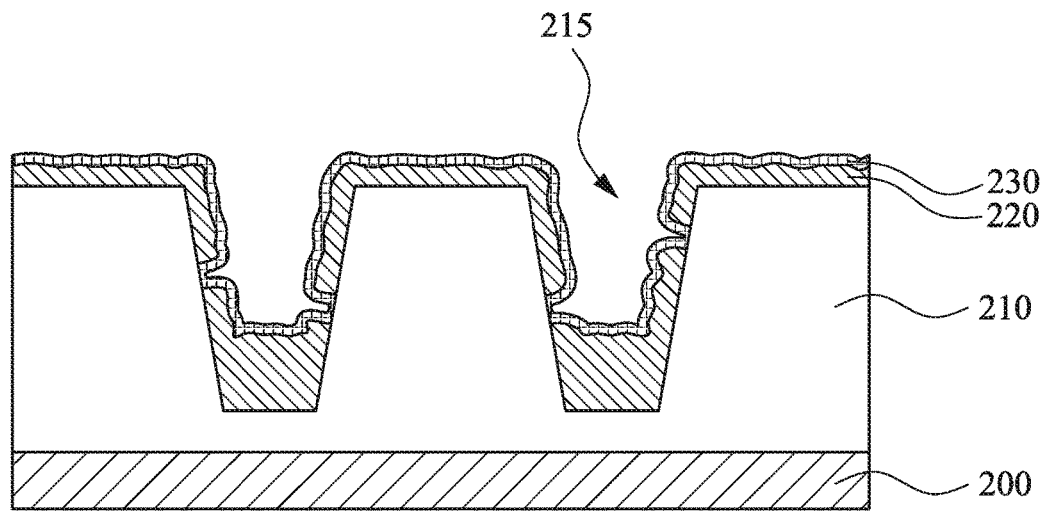
Figure 2D:
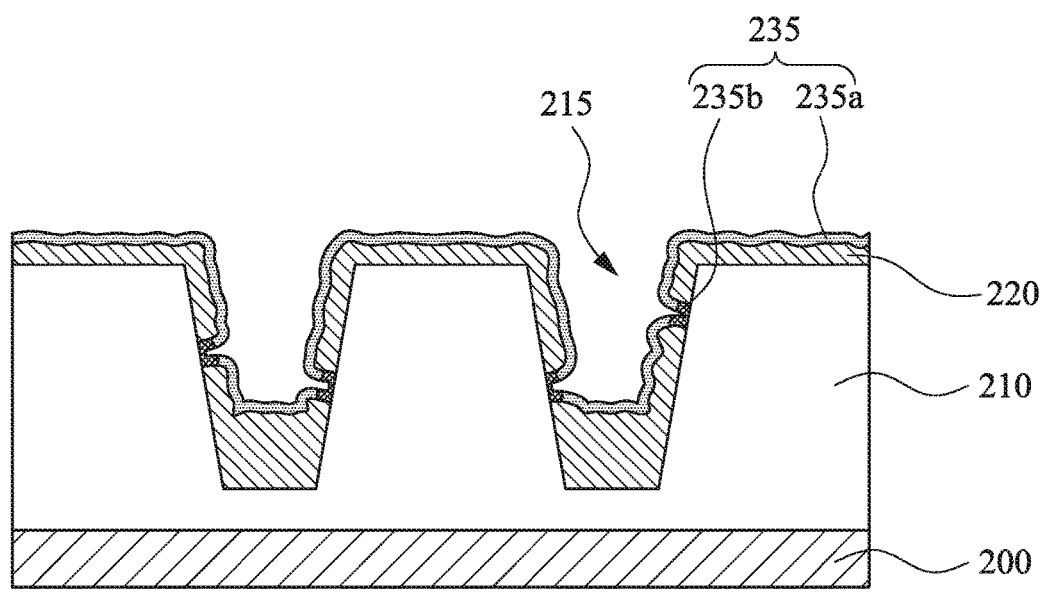

In step 120 of FIG. 1 and FIG. 2B, a barrier layer 220 is formed on the dielectric layer 210 and on the inner surface of the damascene openings 215. The barrier layer 220 on sidewalls of the damascene openings 215 may have some defects 225. The material of the barrier layer 220 can be metal or conductive ceramics. The metal above can be cobalt, ruthenium, tantalum, chromium, nickel, nichrome, hafnium, niobium, zirconium, vanadium, or tungsten, for example. The conductive ceramics above can be tantalum nitride, indium oxide, copper silicide, tungsten nitride, or titanium nitride, for example. The formation method of the barrier layer 220 can be physical vapor deposition or chemical vapor deposition.

Next, a repair layer is formed on the barrier layer 220 by chemical vapor deposition. The whole process of the formation of the repair layer can be divided into two stages. In the first stage (i.e. the step 130 of FIG. 1 and FIG. 2C), a precursor gas is adsorbed on the surface of the barrier layer 220 and the dielectric layer 210 exposed by defects 225 in the barrier layer 220 to form a precursor layer 230. The precursor gas is an organometallic compound containing a central metal atom and surrounding organic ligands.

In the second stage (i.e. the step 140 of FIG. 1 and FIG. 2D), the precursor layer 230 is transformed to a repair layer 235 including a metal portion 235a and an insulating metal oxide portion 235b. The metal portion 235a is transformed from the precursor layer 230 adsorbed on the barrier layer 220. However, the insulating metal oxide portion 235b is transformed from the precursor layer 230 adsorbed on the dielectric layer 210 exposed by the defects 225 in the barrier layer 220, since the surface of the dielectric layer 220 has some free hydroxyl groups, which can coordinate to the central metal atom of the precursor gas. Therefore, the organometallic compound coordinated by the free hydroxyl groups of the dielectric layer 210 is transformed to insulating metal oxide.

The central metal atom above can be Al, Ru, Co, Mn, or Ta, for example. When the central metal atom is Al, the organometallic compound can be trimethylaluminum [Al(CH$_3$)$_3$], or triethylaluminum [Al(C$_2$H$_5$)$_3$], for example.

When the central metal atom is Ru, the organometallic compound can be tricarbonyl [(1,2,3,4-eta)-1,3,-cyclohexadiene] ruthenium, triruthenium dodecacarbonyl [Ru$_3$(CO)$_{12}$], bis(ethylcyclopentadienyl) ruthenium [Ru(EtCp)$_2$], bis(methylcyclopentadienyl) ruthenium [Ru(MeCp)$_2$], or tris(acetylacetonate) ruthenium [Ru(acac)$_3$], for example.

When the central metal atom is Co, the organometallic compound can be dicarbonyl cyclopentadiene [CpCo(CO)$_2$], or dicobalt hexacarbonyl tert-butylacetylene [CO$_2$(CO)$_6$[HC≡C—C(CH$_3$)$_3$], for example.

When the central metal atom is Mn, the organometallic compound can be dimanganese decacarbonyl [Mn$_2$(CO)$_{10}$].

When the central metal atom is Ta, the organometallic compound can be pentakis(dimethylamino) tantalum [Ta(NMe$_2$)$_5$], tris(dimethylamino) (tert-amylimido) tantalum [Ta=N-t-C$_5$H$_{11}$(NMe$_2$)$_3$], tris(ethylmethylami no) (tert-butylimido) tantalum [Ta=N-t-Bu(NMeEt)$_3$], or tris(diethylamino) (tert-butylimido) tantalum [Ta=N-t-Bu(NEt$_2$)$_3$], for example.

The chemical vapor deposition (CVD) above can be thermal CVD, plasma-enhanced CVD, metal-organic CVD, atomic layer deposition (ALD), thermal ALD, or plasma-enhanced ALD, for example.

Figure 2E:
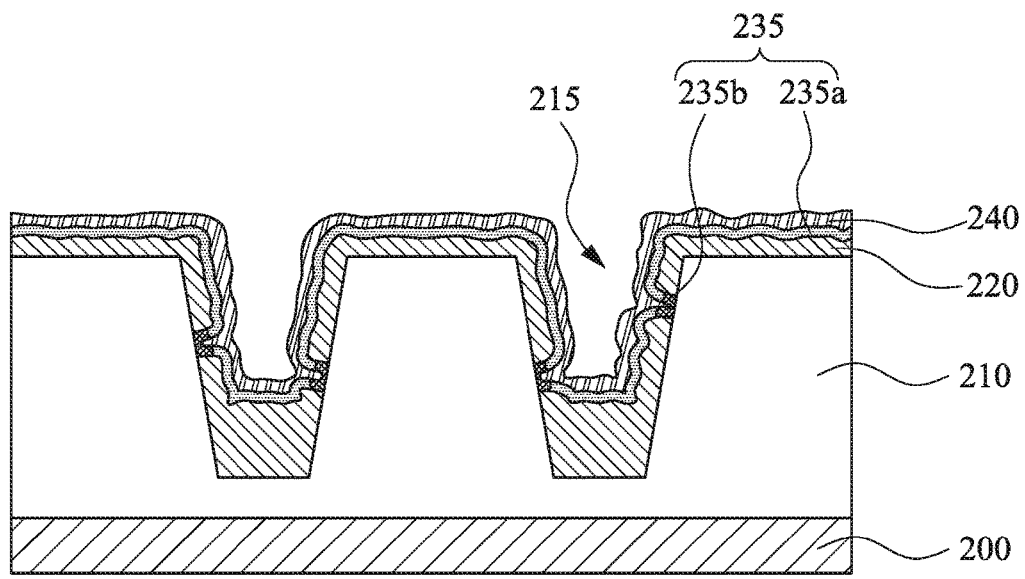

In step 150 of FIG. 1 and FIG. 2E, a seed layer 240 for a later formed metal layer is formed on the repair layer 235. The seed layer 240 can be made from Cu, Co, Al, Ag, or any combinations thereof, for example. The formation method of the seed layer 240 can be sputtering or evaporation.

Figure 2F:
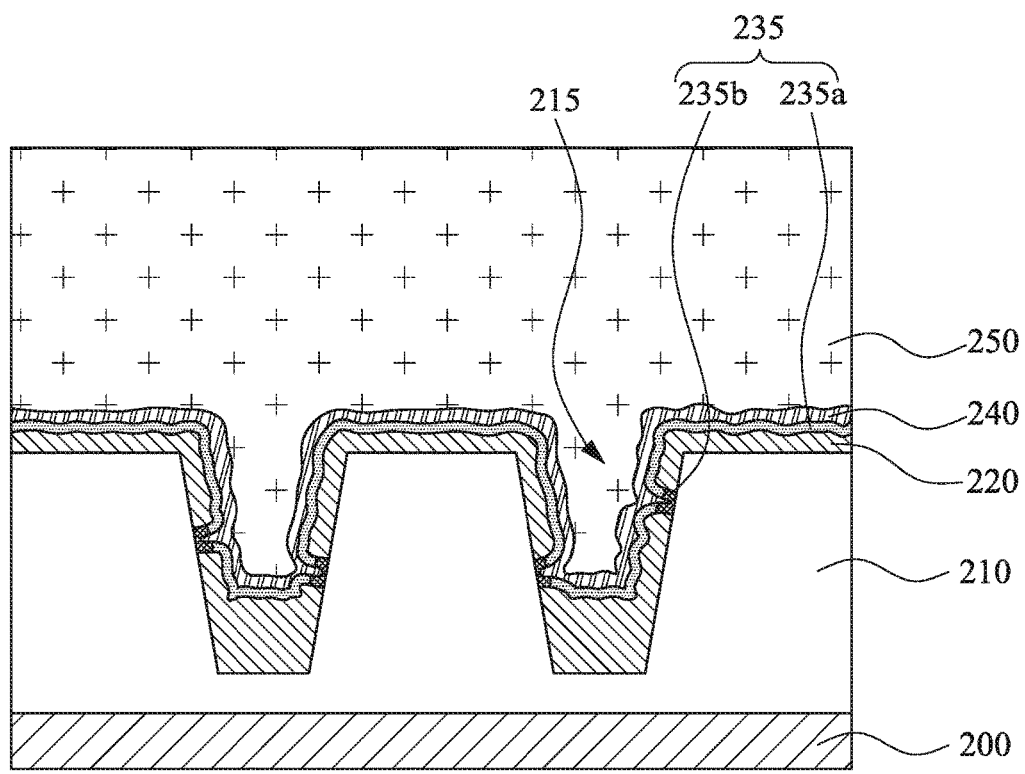

In step 160 of FIG. 1 and FIG. 2F, a metal layer 250 is next formed on the seed layer 240. The metal layer 250 can be made from copper, for example. The formation method of the metal layer 250 can be electroplating, for example.

Figure 2G:
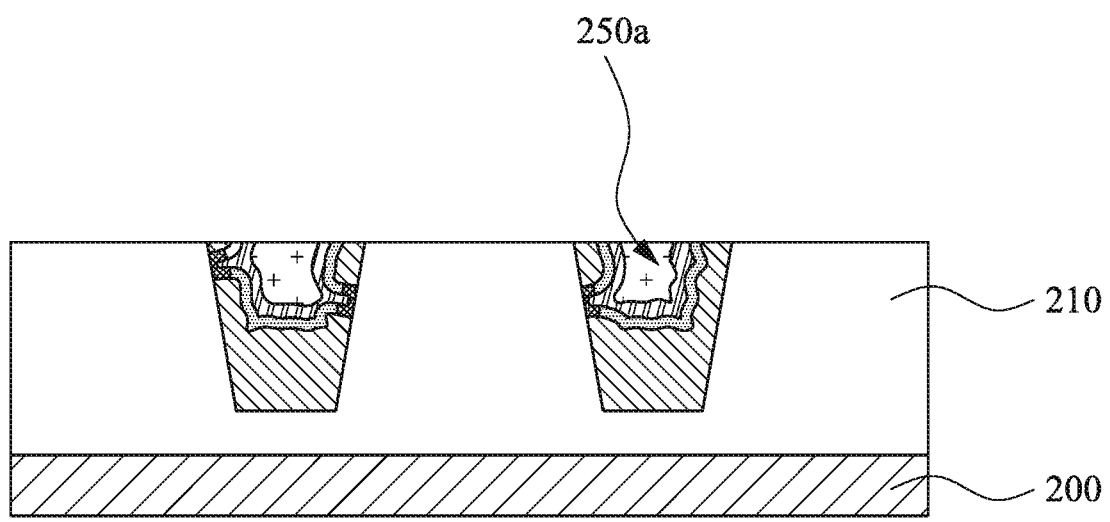

Finally, in step 170 and FIG. 2G, a top portion of the metal layer 250, the seed layer 240, the repair layer 235, the barrier layer 220, and the dielectric layer 210 are removed to leave metal interconnects 250a in the damascene openings 215. The removal method can be chemical mechanical polishing, for example.

Accordingly, a self-aligned repairing process for a barrier layer is provided. The repair layer is formed by chemical vapor deposition. An organometallic compound is used as a precursor gas. The precursor gas adsorbed on the dielectric layer exposed by defects in the barrier layer is transformed to an insulating metal oxide layer, and the precursor gas adsorbed on the barrier layer is transformed to a metal layer. Therefore, the later-formed metal interconnects and the dielectric layer can be completely isolated by the barrier layer and the repair layer to prevent the metal of the metal interconnects from diffusing into the dielectric layer through defects in the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A damascene structure, comprising:
   a dielectric layer disposed on a substrate and having a damascene opening;
   a barrier layer disposed on the dielectric layer having the damascene opening, and comprising two portions separated by a defect;
   a repair layer comprising:
     a conductive portion disposed on the two portions of the barrier layer; and
     an insulating portion disposed in the defect; and
   a seed layer conformally disposed on the repair layer.

2. The damascene structure of claim 1, wherein the defect is on an inner surface of the damascene opening and between the two portions of the barrier layer.

3. The damascene structure of claim 1, wherein the defect is exposing the dielectric layer.

4. The damascene structure of claim 3, wherein the insulating portion of the repair layer is covering the dielectric layer exposed by the defect.

5. The damascene structure of claim 1, wherein the conductive portion of the repair layer is composed of a metal.

6. The damascene structure of claim 5, wherein the metal is Al, Ru, Co, Mn, or Ta.

7. The damascene structure of claim 1, wherein the insulating portion of the repair portion is composed of an insulating metal oxide.

8. The damascene structure of claim 1, wherein the dielectric layer is made of a low-k dielectric material.

9. The damascene structure of claim 1, wherein the dielectric layer has a surface with a plurality of free hydroxyl (—OH) groups.

10. The damascene structure of claim 1, wherein the barrier layer is made of metal or conductive ceramic.

11. The damascene structure of claim 10, wherein the metal is cobalt, ruthenium, tantalum, chromium, nickel, nichrome, hafnium, niobium, zirconium, vanadium or tungsten.

12. The damascene structure of claim 10, wherein the conductive ceramic is tantalum nitride, indium oxide, copper silicide, tungsten nitride or titanium nitride.

13. The damascene structure of claim 1, wherein the seed layer is made of Cu, Co, Al, Ag or a combination thereof.

14. The damascene structure of claim 1, further comprising a metal layer disposed on the seed layer.

15. The damascene structure of claim 14, wherein the metal layer is filled in the damascene opening.

16. The damascene structure of claim 14, the metal layer is made of copper.

17. A damascene structure, comprising:
a dielectric layer disposed on a substrate and having a damascene interconnect;
a barrier layer disposed on an inner surface of the damascene interconnect and comprising two portions separated by a defect exposing the dielectric layer;
a repair layer comprising:
a metal portion laminated on the two portions of the barrier layer; and
an insulating metal oxide portion filled in the defect to cover the dielectric layer exposed by the defect; and
a seed layer conformally disposed on the repair layer.

18. The damascene structure of claim 17, further comprising a metal interconnect disposed on the seed layer and in the damascene interconnect.

19. A damascene structure, comprising:
a dielectric layer disposed on a substrate, wherein the dielectric layer has a damascene opening;
a barrier layer disposed on an inner surface of the damascene opening;
a repair layer disposed on the barrier layer, wherein the repair layer disposed on the barrier layer is composed of a metal, and the repair layer disposed on the dielectric layer exposed by defects in the barrier layer is composed of insulating metal oxide;
a seed layer conformally disposed on the repair layer; and
a metal interconnect disposed in the damascene opening.

20. The damascene structure of claim 19, wherein the metal of the repair layer is Al, Ru, Co, Mn, or Ta.

* * * * *